US012761261B2

(12) United States Patent
Frauendorfer et al.

(10) Patent No.: US 12,761,261 B2
(45) Date of Patent: Oct. 13, 2026

(54) MECHANIZED IRRIGATION MACHINE THAT USES TIME DOMAIN REFLECTIVITY TO FIND AN OPEN SWITCH OR WIRE

(71) Applicant: Lindsay Corporation, Omaha, NE (US)

(72) Inventors: Derick James Frauendorfer, Omaha, NE (US); Bradford L. Ellison, Omaha, NE (US); Robert Stamm, Omaha, NE (US); Luke Joseph Barker, Omaha, NE (US); Mark William Miller, Omaha, NE (US); Steve Aikman, Omaha, NE (US)

(73) Assignee: Lindsay Corporation, Omaha, NE (US)

( * ) Notice: Subject to any disclaimer, the term of this patent is extended or adjusted under 35 U.S.C. 154(b) by 192 days.

(21) Appl. No.: 18/410,514

(22) Filed: Jan. 11, 2024

(65) Prior Publication Data

US 2024/0241167 A1 Jul. 18, 2024

Related U.S. Application Data

(60) Provisional application No. 63/484,868, filed on Feb. 14, 2023, provisional application No. 63/479,578, filed on Jan. 12, 2023.

(51) Int. Cl.
*G01R 31/11* (2006.01)
*A01G 25/16* (2006.01)
(Continued)

(52) U.S. Cl.
CPC ............ *G01R 31/11* (2013.01); *A01G 25/162* (2013.01); *G01R 31/085* (2013.01); *A01G 25/09* (2013.01)

(58) Field of Classification Search
CPC .. G01R 31/11; A01G 9/02–033; A01G 9/247; A01G 27/00–06; A01G 25/00–167
See application file for complete search history.

(56) References Cited

U.S. PATENT DOCUMENTS 3,785,400 A * 1/1974 Zimmerer ................ H02H 7/00 239/731
9,949,450 B2 4/2018 Richings, Sr. et al.
(Continued)

FOREIGN PATENT DOCUMENTS

KR 10-2021-0147727 12/2021
KR 10-2022-0135029 10/2022
WO 2013-052166 A1 4/2013

OTHER PUBLICATIONS

International Search Report and Written Opinion in related PCT Application PCT/US2024/011313 mailed May 7, 2024, 9 pages.

*Primary Examiner* — Lee E Rodak
*Assistant Examiner* — Demetrius R Pretlow
(74) *Attorney, Agent, or Firm* — HOVEY WILLIAMS LLP

(57) ABSTRACT

An irrigation system comprises a plurality of towers, a time domain reflectometry (TDR) unit, and a central controller. Each tower includes a successive one of a plurality of safety switches, with each safety switch being either closed or open. The safety switch of each tower is electrically connected to at least one safety switch of another tower. The TDR unit is electrically connected to at least one safety switch and is configured to output data regarding an open safety switch. The central controller is configured to receive data from the TDR unit, and determine, according to the data from the TDR unit, at least one of a location of the open safety switch and an identifier of the tower associated with the open safety switch.

18 Claims, 6 Drawing Sheets

(51) Int. Cl.
*G01R 31/08* (2020.01)
*A01G 25/09* (2006.01)

(56) References Cited

U.S. PATENT DOCUMENTS

| | | | |
|---|---|---|---|
| 10,729,059 B2 | 8/2020 | Canyon | |
| 11,326,867 B1 * | 5/2022 | Stewart .................... | G01B 7/31 |
| 2002/0107582 A1 | 8/2002 | Pollak et al. | |
| 2011/0304222 A1 | 12/2011 | Pickerill et al. | |
| 2012/0305682 A1 | 12/2012 | Korus | |
| 2018/0141069 A1 * | 5/2018 | Lemkin ................ | G05D 7/0676 |
| 2022/0365496 A1 | 11/2022 | Larue et al. | |

* cited by examiner

MECHANIZED IRRIGATION MACHINE THAT USES TIME DOMAIN REFLECTIVITY TO FIND AN OPEN SWITCH OR WIRE

CROSS-REFERENCE TO RELATED APPLICATIONS

The current patent application is a non-provisional utility patent application which claims priority benefit, with regard to all common subject matter, of earlier-filed U.S. Provisional Application Ser. No. 63/479,578; titled "MECHANIZED IRRIGATION MACHINE THAT USES TIME DOMAIN REFLECTIVITY TO FIND AN OPEN SWITCH OR WIRE"; filed Jan. 12, 2023 and U.S. Provisional Application Ser. No. 63/484,868; titled "MECHANIZED IRRIGATION MACHINE THAT USES TIME DOMAIN REFLECTIVITY TO FIND AN OPEN SWITCH OR WIRE"; filed Feb. 14, 2023. The two Provisional Applications are hereby incorporated by reference, in their entireties, into the current patent application.

FIELD OF THE INVENTION

Embodiments of the current invention relate to mechanized irrigation systems that include a plurality of safety switches.

BACKGROUND OF THE INVENTION

Mechanized irrigation systems comprise a plurality of spaced-apart, motorized, and self-propelled towers which support a fluid-carrying conduit and sprayer system that sprays the fluid on one or more crops. In a center-pivot irrigation system, the conduit is coupled to a fluid source at a center pivot point, and the towers travel in a roughly circular path around the center pivot. Between each adjacent pair of towers is a successive one of a plurality of sections of the conduit, wherein each adjacent pair of conduit sections is coupled with a successive one of a plurality of joints that is flexible. The towers travel independently of one another and may travel at different speeds and at different times. Thus, during normal operation, the towers may travel such that there is a non-zero alignment angle between adjacent sections of the conduit. Some variation of the alignment angle, both positive and negative, is acceptable. However, for numerous reasons the alignment angle may exceed a safe threshold. To monitor the alignment angle, each tower includes a safety switch coupled to the conduit on each adjacent section. The safety switch will open if the alignment angle between the two associated sections of conduit exceeds the safe threshold. A central controller, which controls the operation of the irrigation system, senses the open switch and shuts down the operation of the irrigation system. The central controller may also transmit an error message which alerts a technician to attend the irrigation system and repair, replace, or reposition the tower which has caused the alignment error that opened the safety switch. A problem may arise with irrigation systems that include dozens of towers and may be thousands of feet long. It may be difficult to determine which tower has the problem.

SUMMARY OF THE INVENTION

Embodiments of the current invention address one or more of the above-mentioned problems and provide irrigation systems that detect an open safety switch and determine an identifier and/or a location of the tower associated with the open safety switch. One embodiment of the irrigation system broadly comprises a plurality of towers, a time domain reflectometry (TDR) unit, and a central controller. Each tower includes a successive one of a plurality of safety switches, with each safety switch being either closed or open. The safety switch of each tower is electrically connected to at least one safety switch of another tower. The TDR unit is electrically connected to at least one safety switch and is configured to output data regarding an open safety switch. The central controller is configured to receive data from the TDR unit, and determine, according to the data from the TDR unit, at least one of a location of the open safety switch and an identifier of the tower associated with the open safety switch.

Another embodiment of the current invention provides an irrigation system broadly comprising a plurality of towers, a time domain reflectometry (TDR) unit, and a central controller. Each tower includes a successive one of a plurality of safety switches, with each safety switch being either closed or open. The safety switch of each tower is electrically connected to at least one safety switch of another tower. The TDR unit is electrically connected to at least one safety switch and is configured to output an electronic TDR signal, receive reflections of the TDR signal, and output data specifying a distance from the TDR unit to an open safety switch. The central controller is configured to receive data from the TDR unit, and perform mathematical calculations on the data to determine at least one of a location of the open safety switch and an identifier of the tower associated with the open safety switch.

Yet another embodiment of the current invention provides a method for identifying an open safety switch in an irrigation system, wherein the irrigation system includes a plurality of towers. The method comprises: electrically connecting a TDR unit to at least one safety switch in the irrigation system, the irrigation system including a plurality of safety switches electrically connected to one another in series, each safety switch being either open or closed and being associated with a successive one of the towers; and instructing the TDR unit to output a TDR signal, receive reflections of the TDR signal, and determine a distance from the TDR unit to an open safety switch.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF DRAWINGS

Embodiments of the current invention are described in detail below with reference to the attached drawing figures, wherein.

Figure 1:
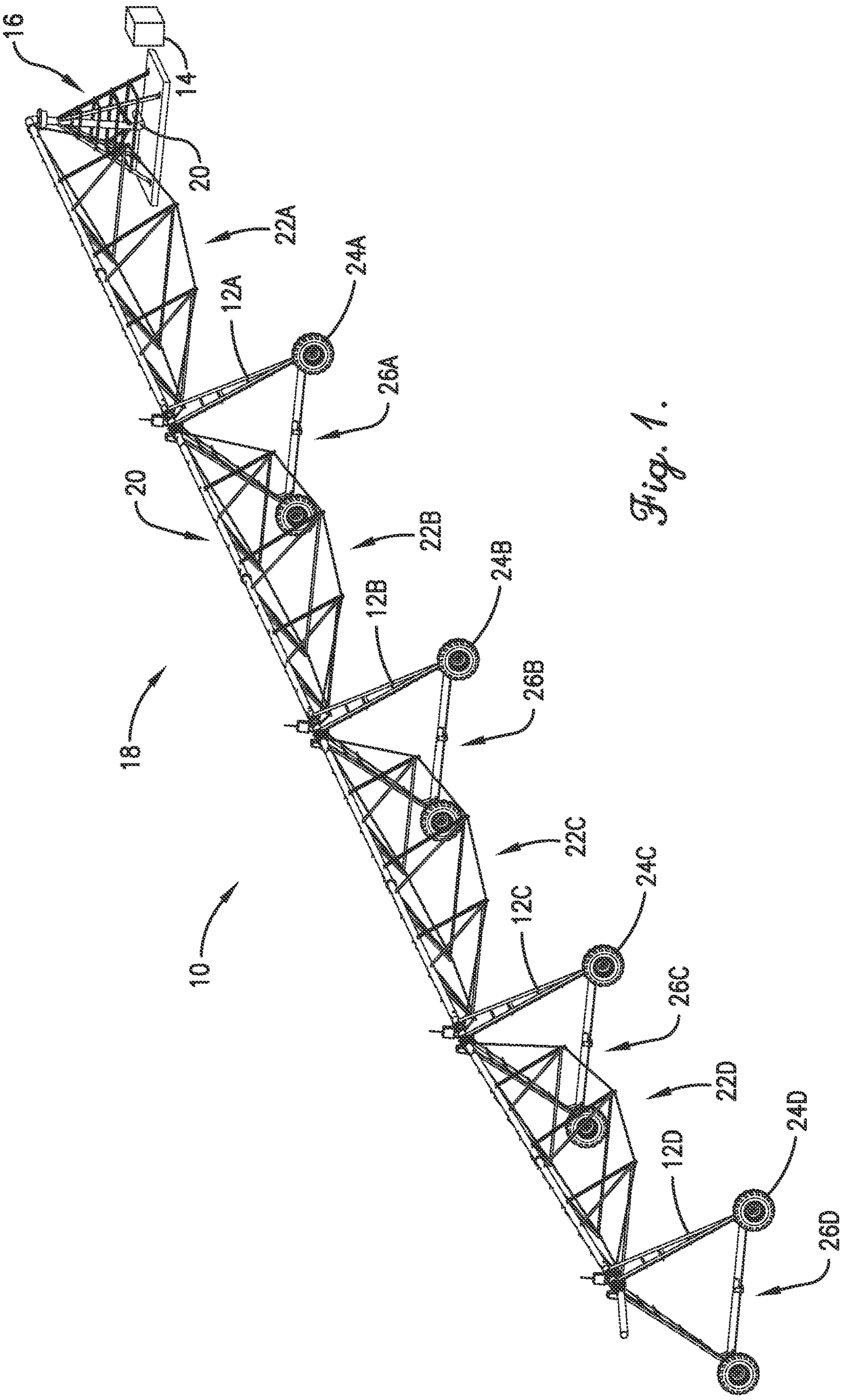
FIG. 1 is a perspective environmental view of an irrigation system, constructed in accordance with various embodiments of the current invention, including a plurality of towers and a plurality of safety switches, each safety switch associated with a successive one of the towers, the irrigation system configured to determine a location or an identifier of an open safety switch.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE INVENTION

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

In the following description, the word "voltage" may be used to describe electric voltage, the word "current" may be used to describe electric current, and the word "power" may be used to describe electric power. In addition, the word "signal" may be used to describe an electromagnetic wave conducted through an electrically conductive medium in which a voltage and/or a current varies, or may be constant, over time.

A mechanized irrigation system 10, constructed in accordance with various embodiments of the current invention, is shown in FIG. 1. The irrigation system 10 broadly comprises a plurality of towers 12 which support fluid delivery components along with a central controller 14 that controls operation of the irrigation system 10. An exemplary embodiment of the irrigation system 10, shown in FIG. 1, is a center pivot irrigation system and broadly comprises a fixed center pivot 16 and a main section 18 pivotally connected to the center pivot. The irrigation system 10 may also comprise an extension arm (also commonly referred to as a "swing arm" or "corner arm") pivotally connected to the free end of the main section 18. The irrigation system 10 may also be embodied by a lateral, or linear, move apparatus which irrigates while moving in a linear, or near-linear, direction without departing from the scope of the current invention.

The fixed center pivot 16 may be a tower or any other support structure about which the main section 18 may pivot. The center pivot has access to a well, water tank, or other source of water or other fluid and may also be coupled with a tank or other source of agricultural products to inject fertilizers, pesticides and/or other chemicals into the water for application during irrigation. The center pivot 16 may supply water to a conduit 20 which carries the water along the length of the main section 18.

The main section 18 may comprise any number of mobile support towers 12A-D, the outermost tower 12D of which is referred to herein as an end tower. The towers 12A-D are connected to the fixed center pivot 16 and to one another by truss sections 22A-D or other supports to form a number of interconnected spans.

The towers 12 have wheels 24A-D, at least one of which is driven by suitable drive motors 26A-D. Each motor 26A-D turns at least one of its wheels 24A-D through a drive shaft to propel its tower 12 and thus the main section 18 in a circle about the center pivot 16 to irrigate a field. The motors 26 may also have several speeds or be equipped with variable speed drives. The operation of the motors 26A-D, such as whether they are on or off, the speed of travel, and the direction of travel, may be controlled with one or more electronic signals or digital data.

Each of the truss sections 22A-D carries or otherwise supports the conduit 20 and other fluid distribution mechanisms that are connected in fluid communication to the conduit 20. Fluid distribution mechanisms may include sprayers or diffusers, each optionally attached to a drop hose, or the like. Between each adjacent pair of towers 12A-D is a successive one of a plurality of sections of the conduit 20, wherein each adjacent pair of conduit 20 sections is coupled with a successive one of a plurality of joints that is flexible. In addition, the conduit 20 may include one or more valves which control the flow of water through the conduit 20. The opening and closing of the valves may be automatically controlled with an electronic signal or digital data.

The irrigation system 10 may also include wired or wireless communication electronic components that communicate with a communication network and allow the valves and the motors 26 to receive the electronic signals and/or digital data which control the operation of the valves and the motors 26.

The irrigation system 10 may also include an optional extension arm (not shown) pivotally connected to the end tower 12D and may be supported by a swing tower 12 with steerable wheels 24 driven by a motor 26. The extension arm may be joined to the end tower 12D by an articulating pivot joint. The extension arm is folded in relative to the end tower 12D when it is not irrigating a corner of a field and may be pivoted outwardly away from the end tower 12D while irrigating the corners of a field.

The irrigation system 10 illustrated in FIG. 1 has four towers 12A-D; however, it may comprise any number of towers, truss sections, wheels, and drive motors without departing from the scope of the current invention.

The irrigation system 10 may further include one or more sensors which measure the amount of water delivered from the irrigation system 10 to the crop. The sensors may communicate with the communication network to report the amount of delivered water. The water may be reported as a depth in units of millimeters (mm) or inches (in).

The irrigation system 10 further includes a plurality of safety switches 30, with each safety switch 30 being positioned at, and associated with, a successive one of the towers 12 and coupled to the two adjacent sections of the conduit 20 that are joined at the tower 12. Each safety switch 30 monitors an alignment angle between one section of the conduit 20 and its adjacent inward section of the conduit 20. The safety switch 30 opens when its associated tower 12 moves the section of conduit 20 is in an unsafe alignment or position, which, in turn, leads to the central controller 14 shutting down operation of the irrigation system 10. While the exemplary irrigation system 10 includes four towers 12, real world irrigation systems 10 may include up to a couple of dozen towers 12. Thus, it is helpful to a technician who has to restore or repair the irrigation system 10 to know which tower 12 has the problem. To assist the technician, the irrigation system 10 also includes a time domain reflectometry (TDR) unit 32 which is configured to identify the tower 12 that is in need of repair.

Figure 2:
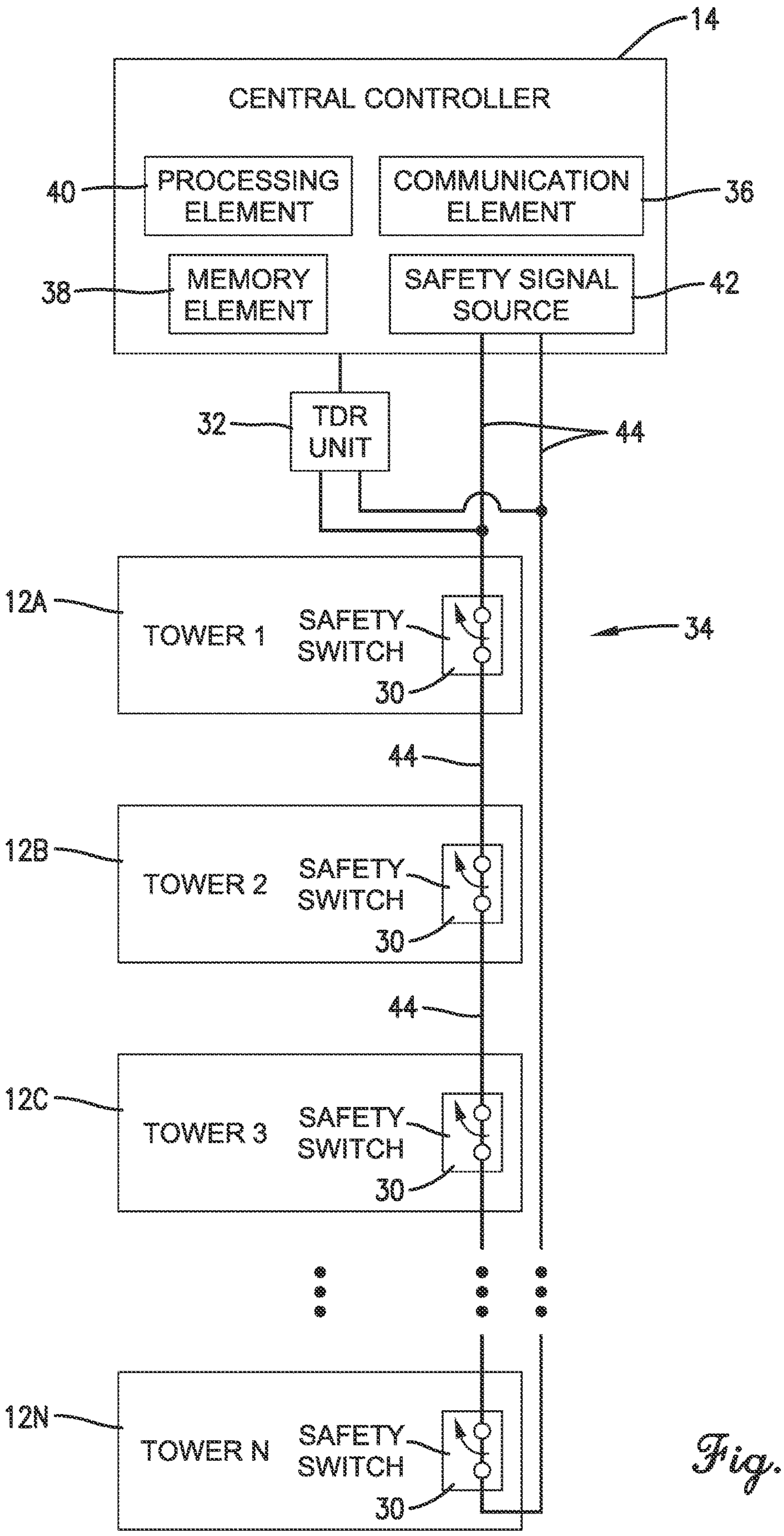
FIG. 2 is a schematic block diagram of a first configuration of an electrical connection of the safety switches, a central controller, and a time domain reflectometer (TDR) unit.

Referring to FIG. 2, a first configuration of the central controller 14, the safety switches 30, the TDR unit 32, and a safety circuit 34 is shown. The first configuration provides a fixed positioning of the TDR unit 32, typically in proximity to the central controller 14.

The central controller 14 generally controls the operation of the irrigation system 10 and broadly comprises a communication element 36, a memory element 38, a processing element 40, and a safety signal source 42.

The communication element 36 generally allows the central controller 14 to communicate with external systems, computing networks, telecommunication networks, the Internet, and the like. The communication element 36 may include signal and/or data transmitting and receiving circuits, such as antennas, amplifiers, filters, mixers, oscillators, digital signal processors (DSPs), and the like. The communication element 36 may establish communication wirelessly by utilizing radio frequency (RF) signals and/or data that comply with communication standards such as cellular 2G, 3G, 4G, Voice over Internet Protocol (VOIP), LTE, Voice over LTE (VOLTE), or 5G, Institute of Electrical and Electronics Engineers (IEEE) 802.11 standard such as WiFi, IEEE 802.16 standard such as WiMAX, Bluetooth™, or combinations thereof. In addition, the communication element 36 may utilize communication standards such as ANT, ANT+, Bluetooth™ low energy (BLE), the industrial, scientific, and medical (ISM) band at 2.4 gigahertz (GHz), or the like. Alternatively, or in addition, the communication element 36 may establish communication through connectors or couplers that receive metal conductor wires or cables which are compatible with networking technologies such as ethernet. In certain embodiments, the communication element 36 may also couple with optical fiber cables. The communication element 36 may be in electronic communication with the memory element 38 and the processing element 40.

The memory element 38 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, solid state memory, or the like, or combinations thereof. In some embodiments, the memory element 38 may be embedded in, or packaged in the same package as, the processing element 40. The memory element 38 may include, constitute, or embody, a non-transitory "computer-readable medium". The memory element 38 may store the instructions, code, code statements, code segments, software, firmware, programs, applications, apps, services, daemons, or the like that are executed by the processing element 40. The memory element 38 is in electronic communication with the processing element 40 and may also store data that is received by the processing element 40 or the device in which the processing element 40 is implemented. The processing element 40 may further store data or intermediate results generated during processing, calculations, and/or computations as well as data or final results after processing, calculations, and/or computations. In addition, the memory element 38 may store settings, text data, documents from word processing software, spreadsheet software and other software applications, sampled audio sound files, photograph or other image data, movie data, databases, and the like.

The processing element 40 may comprise one or more processors. The processing element 40 may include electronic hardware components such as microprocessors (single-core or multi-core), microcontrollers, digital signal processors (DSPs), field-programmable gate arrays (FPGAs), analog and/or digital application-specific integrated circuits (ASICs), intelligence circuitry, or the like, or combinations thereof. The processing element 40 may generally execute, process, or run instructions, code, code segments, code statements, software, firmware, programs, applications, apps, processes, services, daemons, or the like. The processing element 40 may also include hardware components such as registers, finite-state machines, sequential and combinational logic, configurable logic blocks, and other electronic circuits that can perform the functions necessary for the operation of the current invention. In certain embodiments, the processing element 40 may include multiple computational components and functional blocks that are packaged separately but function as a single unit. In some embodiments, the processing element 40 may further include multiprocessor architectures, parallel processor architectures, processor clusters, and the like, which provide high performance computing. The processing element 40 may be in electronic communication with the other electronic components of the central controller 14 through serial or parallel links that include universal busses, address busses, data busses, control lines, and the like. In addition, the processing element 40 may include ADCs to convert analog electronic signals to (streams of) digital data values and/or digital to analog converters (DACs) to convert (streams of) digital data values to analog electronic signals.

The processing element 40 is operable, configured, and/or programmed to perform the functions, operations, processes, methods, and/or algorithms of the central controller 14 by utilizing hardware, software, firmware, or combinations thereof. Other components, such as the communication element 36 and the memory element 38 may be utilized as well. The processing element 40 generally controls the operation of the irrigation system 10 by receiving data from sensors and other components and by outputting control signals to the valves and drive motors 26. The data from the sensors may include data about the amount of water that is being delivered to the crops. As a result, the processing element 40 may output signals to the valves to control the flow of water and to the drive motors 26 to control the speed of travel of the towers 12 according to the values of the data.

The processing element 40 may also receive a status signal from the safety signal source 42. If the status signal indicates that the safety signal is being received, then the processing element 40 takes no specific action. If the status signal indicates that the safety signal is not being received, then the processing element 40 may delay for a short period of time in case one of the safety switches 30 momentarily opened and then closed again. After the delay, the processing element 40 may halt operation of the irrigation system 10 by terminating the flow of water and stopping the movement of the towers 12.

The processing element 40 may output a control signal or data to the TDR unit 32 which instructs the TDR unit 32 to output a TDR signal, as described in more detail below. The processing element 40 may further receive a TDR data signal from the TDR unit 32 which indicates whether the safety circuit 34 is in the normal state or whether at least one of the safety switches 30 is open. The status signal may also indicate a distance from the TDR unit 32 to the open safety switch 30. The processing element 40 may be programmed or configured with a distance between each tower 12 and/or a distance from the center pivot 16 to each tower 12 as well as a distance from the center pivot 16 to the TDR unit 32. Additionally, or alternatively, the processing element 40 may be programmed or configured with, or may receive or determine, the location (or geolocation) of the TDR unit 32 as well as the location of each of the towers 12 and, by extension, the location of each safety switch 30. Thus, given the distance from the TDR unit 32 to the open safety switch 30, the processing element 40 may perform mathematical calculations on the data to determine an identification, such as a numerical value representing the order, of the tower 12 with the open safety switch 30 which varies according to the distance from the TDR unit 32 to the open safety switch 30. A simple calculation may be to divide the distance from the TDR unit 32 to the open safety switch 30 by the distance between each tower 12. The calculation may be more complex if the distance between adjacent towers 12 is not constant and/or if the TDR unit 32 is not located at the center pivot 16. For example, the distance from the TDR unit 32 to the open safety switch 30 may be 200 feet. If the distance between each two adjacent towers 12 is 50 feet, the distance from the center pivot 16 to the first tower 12A is 50 feet, the TDR unit 32 is located at the center pivot 16, then the tower 12 associated with the open switch 30 may be calculated as 200/50=4, the fourth tower 12. Additionally, or alternatively, the processing element 40 may determine a location (or geolocation) of the open safety switch 30 which varies according to the distance from the TDR unit 32 to the open safety switch 30.

The processing element 40 may in addition output a message, that is transmitted through the communication element 36, indicating that one of the safety switches 30 has opened and the irrigation system 10 has shut down. The message may also indicate the number, or identification, of the tower 12 with the open safety switch 30. The message may be received by an external receiver, such as an operations center, an owner of the property, a technician who maintains the irrigation system 10, or combinations thereof. Alternatively, or additionally, the central controller 14 may include a display at the center pivot which displays the message.

The safety signal source 42 generally outputs and receives an electronic safety signal and senses when the safety signal is not received. The safety signal source 42 may include various combinations of a voltage source, a current source, a voltage sensor, a current sensor, an electric impedance sensor, and the like. The safety signal source 42 further includes a first port and a second port. The safety signal source 42 may generate the safety signal as a voltage across the first and second ports, a current from one of the ports, and/or may detect the safety signal as an electric impedance across the first and second ports. Typically, the amount of current output by the safety signal source is limited to prevent current overload. While the safety signal is being output and received, the voltage is low, the current is at a non-zero value, and/or the electric impedance is low. When the safety signal is no longer received, the voltage increases, the current decreases to zero, and/or the electric impedance increases to a maximum value. In addition, the safety signal source outputs a binary electronic status signal which indicates whether the safety signal is being received or if the safety signal is not being received.

Each safety switch 30 is embodied by a single-pole, single-throw (SPST) type switch, or a binary state toggle-type switch, including a first terminal and a second terminal with a moveable contact providing electrical connection between the terminals in a closed position and no electrical connection in an open position. The safety switch 30 is closed when the alignment angle between the two sections of the conduit 20 joined at the associated tower 12 is below or equal to a safety threshold value and open when alignment angle is above the safety threshold value. The safety switch 30 may be implemented as a limit switch that is integrated in a mechanical assembly which includes a rotating cam mechanically coupled to the conduit 20 at the joint where two sections of the conduit 20 are connected. The cam rotates in response to the rotation of the outward section of the conduit 20 with respect to the inward section of the conduit 20, and thus the angular position of the cam represents the alignment angle between the two sections of the conduit 20. An exemplary embodiment of the safety switch 30 assembly is described in U.S. Pat. No. 9,538,712, which is hereby incorporated by reference, in its entirety, into the current patent application, except where inconsistent with the teachings of the current patent application. Rotation of the cam beyond the safety threshold angle, in either the clockwise direction or the counter clockwise direction, opens the safety switch 30.

The safety circuit 34 includes each of the safety switches 30 and a plurality of electrically conductive cables (wires) 44. A first cable 44 electrically connects the first port of the safety signal source 42 to the safety switch at the first tower 12A. A successive one of the cables 44 electrically connects each successive adjacent pair of safety switches 30 to one another so that all of the safety switches 30 are electrically connected in series. And, another cable 44 electrically connects the safety switch 30 at the final tower 12N to the second port of the safety signal source 42. The safety circuit 34 forms an electrically conductive closed circuit path when all of the safety switches 30 are closed, which may be known as a "normal state".

The TDR unit 32 generally outputs a TDR signal on an electrically conductive path and determines characteristics of the path according to, or based on, a reflection of the TDR signal. Specifically, the TDR unit 32 outputs the TDR signal to the safety circuit 34 and determines characteristics of the safety circuit 34 according to the reflection of the TDR signal. The TDR unit 32 may include electronic signal generators and receivers, DSPs, signal filters, signal amplifiers, and the like. The TDR unit 32 includes a first port and a second port. The first port may be electrically connected to the cable 44 electrically connecting the first port of the safety signal source 42 to the safety switch 30 at the first tower 12A. The second port may be electrically connected to the cable 44 electrically connecting the safety switch 30 at the last tower 12N to the second port of the safety signal source 42. Alternatively, the TDR unit 32 may be electrically connected to the safety circuit 34 at the safety signal source 42, with the first port of the TDR unit 32 being electrically connected to the first port of the safety signal source 42 and the second port of the TDR unit 32 being electrically connected to the second port of the safety signal source 42.

The TDR unit 32 may output or transmit the TDR signal on one port and receive reflections of the TDR signal on the other port. Or, the TDR unit 32 may output the TDR signal and receive reflections of the TDR signal on the same port. The TDR signal may be a step or an impulse of voltage or current. The features of the reflections of the TDR signal, such as the amplitude and polarity, may indicate whether the safety circuit 34 is in the normal state (with all of the safety switches 30 closed) or whether one of the safety switches 30 is open. The time delay between the transmission of the TDR signal and the reception of the reflections may indicate a distance from the TDR unit 32 to the open safety switch 30. Thus, the TDR unit 32 may output or transmit the TDR signal and receive the reflections of the TDR signal. According to the features of the reflections, the TDR unit 32 may determine whether at least one of the safety switches 30 is open. According to the time delay between the transmission of the TDR signal and the reception of its reflections, the TDR unit 32 may determine the distance, or a representation of the distance, from the TDR unit 32 to the open safety switch 30. In various embodiments, the TDR unit 32 may also be programmed or configured with the type of cables 44 utilized in the safety circuit 34 or with data regarding the propagation of electromagnetic radiation along the cables 44.

In addition, the TDR unit 32 may include a third port configured to communicate with the processing element 40 of the central controller 14 either wirelessly using known RF wireless communication protocols or through electrically conductive cables. Through the third port, the TDR unit 32 may output a TDR data signal that indicates whether the safety circuit 34 is in the normal state or whether at least one of the safety switches 30 is open. The TDR data signal may also indicate the distance, or may include data indicating or representing the distance, from the TDR unit 32 to the open safety switch 30.

Through the third port, the TDR unit 32 may also receive a control signal or data that instructs the TDR unit 32 to output the TDR signal. Accordingly, the TDR unit 32 may output the TDR signal when it receives the instruction. Afterward, the TDR unit 32 may output the TDR data signal. Additionally, or alternatively, the TDR unit 32 may output the TDR signal at regular periodic intervals, such as once every 1 second, 10 seconds, 1 minute, or the like. The TDR unit 32 may also be configured to output the TDR data signal at the same interval.

The irrigation system 10 may operate as follows. The irrigation system 10 may be operating under normal parameters. That is, the drive motors 26 may be moving each tower 12 independently, perhaps at different speeds and at different times, such that the successive sections of the conduit 20 are rotating with respect to one another and the alignment angles between adjacent sections are within the safety threshold values. For one of any number of reasons, such as the tires getting stuck in a rut, a high wind event, or the like, one of the towers 12 may experience a problem that results in the alignment angle between the two sections of conduit 20 joined at the tower 12 exceeding the safety threshold value. The safety signal source 42 detects that the safety signal is no longer being received and alerts the processing element 40. After a period of time, the processing element 40 shuts down the operation of the irrigation system 10. The processing element 40 also instructs the TDR unit 32 to output the TDR signal. Alternatively, the TDR unit 32 may output the TDR signal on a regular basis and may detect an open safety switch 30. Either way, the TDR unit 32 determines the distance from the TDR unit 32 to the open safety switch 30 and outputs the distance in the TDR data signal received by the processing element 40. Given the distance, the processing element 40 may determine the identifier or number of the tower 12, and/or the location (or geolocation) of the tower 12, whose associated safety switch 30 is open. The processing element 40 may further output a message indicating the tower 12, or the location of the tower 12, which has the open safety switch 30. Thus, the technician arriving to repair the irrigation system 10 knows which tower 12 to check. In addition, or instead, the message may be displayed on a display at the center pivot 16.

Figure 3:
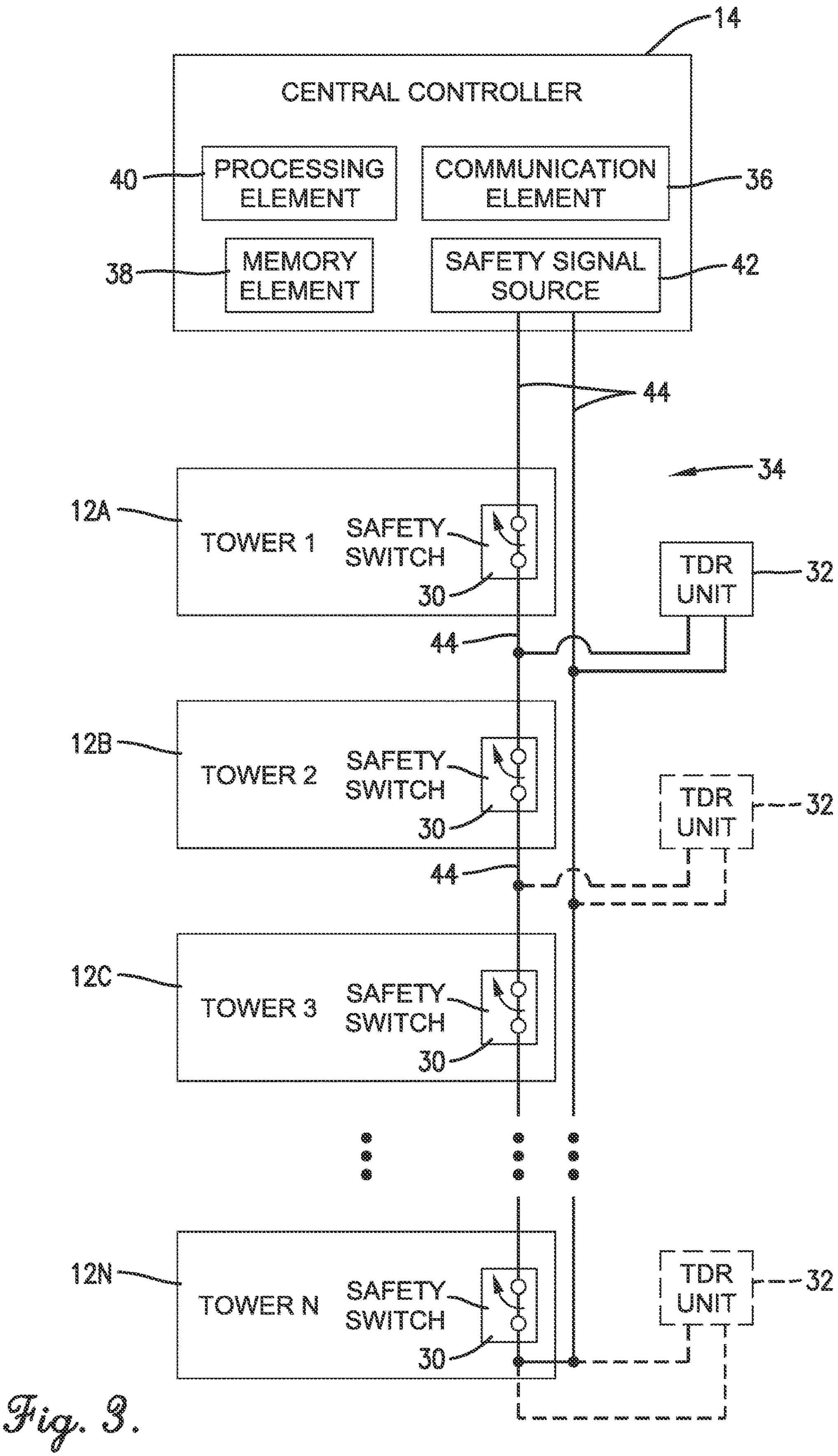
FIG. 3 is a schematic block diagram of a second configuration of the electrical connection of the safety switches, the central controller, and the TDR unit.

Referring to FIG. 3, a second configuration of the central controller 14, the safety switches 30, the safety circuit 34, and the TDR unit 32 is shown. In the second configuration, the TDR unit 32 is not permanently, or fixedly, connected to the safety circuit 34. The second configuration provides a mobile positioning of the TDR unit 32, wherein the TDR unit 32 may be electrically connected at virtually any position along the span of the irrigation system 10—that is, between any two adjacent tower 12. The second configuration may be utilized when one of the safety switches 30 opens, the processing element 40 of the central controller 14 shuts down the operation of the irrigation system 10, and transmits a message indicating that there is a problem with the irrigation system 10, specifically that one of the safety switches 30 has opened. But, the message does not indicate which of the safety switches 30 has opened. Having received the message that there is an open safety switch 30, a technician who has the TDR unit 32 arrives at the irrigation system 10. The technician electrically connects the TDR unit 32 to the safety circuit 34. For example, the technician may electrically connect the TDR unit 32 to the safety circuit 34 between the first tower 12A and the second tower 12B so that the TDR unit 32 is electrically connected to the first safety switch 30 and the second safety switch 30. The first port of the TDR unit 32 may be electrically connected to the cable 44 between the first safety switch 30 and the second safety switch 30. The second port of the TDR unit 32 may be electrically connected to the cable 44 that returns from the last safety switch 30 to the safety signal source 42. The TDR unit 32 may include a user interface through which the technician instructs the TDR unit 32 to output the TDR signal. The TDR unit 32 receives reflections of the TDR signal and determines a distance from the TDR unit 32 to the open safety switch 30. The TDR unit 32 may include a display on which the determined distance is displayed. The technician may then walk the distance to find the open safety switch 30. Alternatively, the TDR unit 32 may be programmed or configured to include distances between the towers 12 of the irrigation system 10. The TDR unit 32 may also be programmed or configured to perform mathematical calculations to determine an identifier or number of the tower 12 whose associated safety switch 30 is open. The TDR unit 32 may display the identifier or number of the tower 12 on its display.

Figure 4:
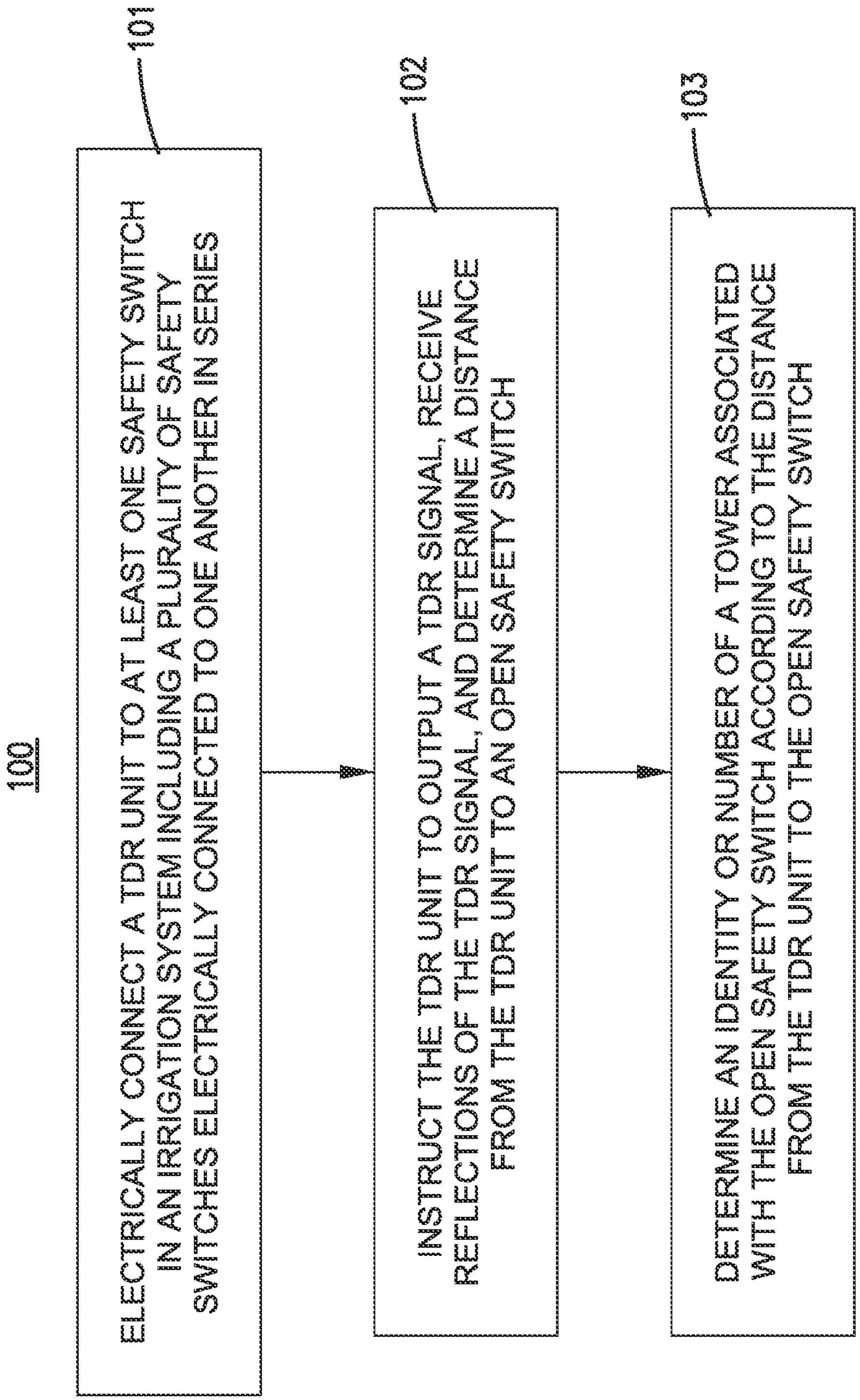
FIG. 4 is a listing of at least a portion of the steps of a method of determining an open safety switch in an irrigation system.

FIG. 4 depicts a listing of at least a portion of the steps of an exemplary method 100 for identifying an open safety switch 30 in an irrigation system 10, wherein which may include a distance from a TDR unit 32 to the open safety switch 30, a location of the open safety switch 30, and/or an identifier, such as an ordinal number, of a tower 12 associated with the open safety switch 30. Variations to the steps may be performed. The steps may be performed in the order shown in FIG. 4, or they may be performed in a different order. Furthermore, some steps may be performed concurrently as opposed to sequentially. In addition, some steps may be optional or may not be performed.

Referring to step 101, a TDR unit 32 is electrically connected to at least one safety switch 30 in the irrigation system 10 including a plurality of safety switches 30 electrically connected to one another in series, as shown in FIGS. 2 and 3. The irrigation system 10 includes at least a plurality of spaced-apart, motorized, and self-propelled towers 12 which support a fluid-carrying conduit 20 and sprayer system that sprays the fluid on one or more crops. Between each adjacent pair of towers 12 is a successive one of a plurality of sections of the conduit 20, wherein each adjacent pair of conduit sections is coupled with a successive one of a plurality of joints that is flexible.

Each safety switch 30 is embodied by a single-pole, single-throw (SPST) type switch, or a binary state toggle-type switch, including a first terminal and a second terminal with a moveable contact providing electrical connection between the terminals in a closed position and no electrical connection in an open position. The safety switch 30 is closed when the alignment angle between the two sections of the conduit 20 joined at the associated tower 12 is below or equal to a safety threshold value and open when alignment angle is above the safety threshold value. The safety switch 30 may be implemented as a limit switch that is integrated in a mechanical assembly which includes a rotating cam mechanically coupled to the conduit 20 at the joint where two sections of the conduit 20 are connected. The cam rotates in response to the rotation of the outward section of the conduit 20 with respect to the inward section of the conduit 20, and thus the angular position of the cam represents the alignment angle between the two sections of the conduit 20. Rotation of the cam beyond the safety threshold angle, in either the clockwise direction or the counter clockwise direction, opens the safety switch 30.

The TDR unit 32 generally outputs a TDR signal on an electrically conductive path and determines characteristics of the path according to, or based on, a reflection of the TDR signal. Specifically, the TDR unit 32 outputs the TDR signal to the safety circuit 34 and determines characteristics of the safety circuit 34 according to the reflection of the TDR signal. The TDR unit 32 may include electronic signal generators and receivers, DSPs, signal filters, signal amplifiers, and the like. The TDR unit 32 includes a first port and a second port. The first port may be electrically connected to the cable 44 electrically connecting the first port of the safety signal source 42 to the safety switch 30 at the first tower 12A. The second port may be electrically connected to the cable 44 electrically connecting the safety switch 30 at the last tower 12N to the second port of the safety signal source 42. Alternatively, the TDR unit 32 may be electrically connected to the safety circuit 34 at the safety signal source 42, with the first port of the TDR unit 32 being electrically connected to the first port of the safety signal source 42 and the second port of the TDR unit 32 being electrically connected to the second port of the safety signal source 42.

In other embodiments, the TDR unit 32 may be manually electrically connected to at least one of the safety switches 30 associated with any of the towers 12.

Referring to step 102, the TDR unit 32 is instructed to output the TDR signal, receive reflections of the TDR signal, and determine a distance to an open safety switch 30. The TDR unit 32 may output or transmit the TDR signal on one port and receive reflections of the TDR signal on the other port. Or, the TDR unit 32 may output the TDR signal and receive reflections of the TDR signal on the same port. The TDR signal may be a step or an impulse of voltage or current. The features of the reflections of the TDR signal, such as the amplitude and polarity, may indicate whether the safety circuit 34 is in the normal state (with all of the safety switches 30 closed) or whether one of the safety switches 30 is open. The time delay between the transmission of the TDR signal and the reception of the reflections may indicate a distance from the TDR unit 32 to the open safety switch 30. Thus, the TDR unit 32 may output or transmit the TDR signal and receive the reflections of the TDR signal. According to the features of the reflections, the TDR unit 32 may determine whether at least one of the safety switches 30 is open. According to the time delay between the transmission of the TDR signal and the reception of its reflections, the TDR unit 32 may determine the distance from the TDR unit 32 to the open safety switch 30. In various embodiments, the TDR unit 32 may also be programmed or configured with the type of cables 44 utilized in the safety circuit 34 or with data regarding the propagation of electromagnetic radiation along the cables 44.

In addition, the TDR unit 32 may include a third port configured to communicate with the processing element 40 of the central controller 14 either wirelessly using known RF wireless communication protocols or through electrically conductive cables. Through the third port, the TDR unit 32 may output a TDR data signal that indicates whether the safety circuit 34 is in the normal state or whether at least one of the safety switches 30 is open. The TDR data signal may also indicate the distance from the TDR unit 32 to the open safety switch 30.

Through the third port, the TDR unit 32 may also receive a control signal or data that instructs the TDR unit 32 to output the TDR signal. The TDR unit 32 may receive the control signal or data from a processing element 40 of a central controller 14 of the irrigation system 10. Accordingly, the TDR unit 32 may output the TDR signal when it receives the instruction. Afterward, the TDR unit 32 may output the TDR data signal. Additionally, or alternatively, the TDR unit 32 may output the TDR signal at regular periodic intervals, such as once every 1 second, 10 seconds, 1 minute, or the like. The TDR unit 32 may also be configured to output the TDR data signal at the same interval.

In other embodiments, the TDR unit 32 may include a user interface through which a technician instructs the TDR unit 32 to output the TDR signal. The TDR unit 32 may further include a display which displays the distance from the TDR unit 32 to the open safety switch 30.

Referring to step 103, an identifier or number of the tower 12 associated with the open safety switch 30 is determined according to the distance from the TDR unit 32 to the open safety switch 30. The distance from the TDR unit 32 to the open safety switch 30 may be communicated from the TDR unit 32 to the processing element 40, which may be programmed or configured to perform mathematical calculations to determine an identification, such as a numerical value representing the order, of the tower 12 with the open safety switch 30. The irrigation system 10 may further include a display which displays the identifier or number of the tower 12 with the open safety switch 30. Additionally, or alternatively, the processing element 40 may further output a message, to be received by an external receiver, such as an operations center or a technician, indicating the tower 12, or the location of the tower 12, which has the open safety switch 30.

In other embodiments, the TDR unit 32 may be programmed or configured to perform mathematical calculations to determine an identifier or number of the tower 12 with the open safety switch 30. The TDR unit 32 may display the identifier or number of the tower 12 on its display.

In another embodiment of the current invention, the irrigation system 10 monitors the safety circuit 34 for a removal of one or more cables 44—such as by theft of the cables 44, particularly ones made from copper. In this embodiment, the irrigation system 10 may also monitor for broken cables 44 or any other fault that causes an open circuit in the safety circuit 34. The irrigation system 10 may have the configuration of the central controller 14, the safety switches 30, the TDR unit 32, and the safety circuit 34 as shown in FIG. 2. The components of the irrigation system 10 maintain all, or at least some, of the features described above.

The TDR unit 32 outputs the TDR signal on a regular periodic basis, such as once every 1 second, 10 seconds, 1 minute, or the like. In some embodiments, the TDR unit 32 is programmed or configured itself to output the TDR signal on the regular periodic basis. In other embodiments, the TDR unit 32 may receive instruction from the processing element 40 to output the TDR signal on the regular periodic basis. Based on the features of the reflections of the TDR signal, the TDR unit 32 determines whether the safety circuit 34 is in the normal state, with all safety switches 30 closed and all cables 44 intact, or whether there is any fault in the safety circuit 34 such as a missing or broken cable 44 or an open safety switch 30. (If any of these situations occur, the safety signal will no longer be received by the safety signal source 42, so the processing element 40 will shut the irrigation system 10 down.) Based on the time delay of the reflections of the TDR signal, the TDR unit 32 may also determine a distance to the missing or broken cable 44 or the open switch 30. When the TDR unit 32 determines an abnormal state in the safety circuit 34, the TDR unit outputs the TDR data signal, which may include an alert that the safety circuit 34 is in an abnormal state, that there is a missing or broken cable 44, that there is an open switch 30, a distance to the missing or broken cable 44 or the open switch 30, or combinations thereof. The TDR data signal is received by the processing element 40, which in response, outputs an alert message, that is transmitted through the communication element 36, indicating that one of the cables 44 is missing or broken or one of the safety switches 30 has opened and the irrigation system 10 has shut down. The message may be received by an operations center, an owner of the property, a technician who maintains the irrigation system 10, or combinations thereof.

Figure 5:
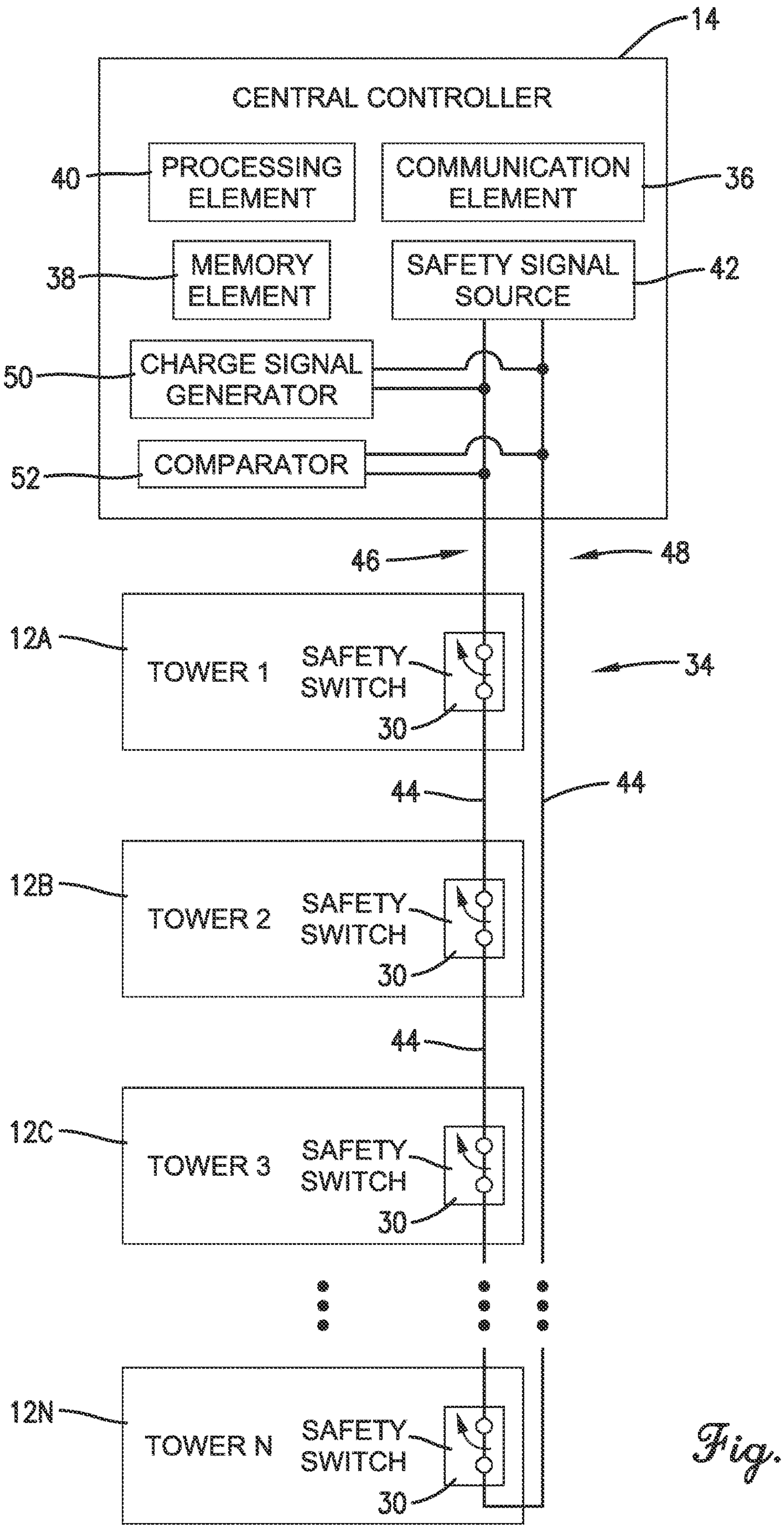
FIG. 5 is a schematic block diagram of a third configuration of the electrical connection of the safety switches, and the central controller.
Figure 6:
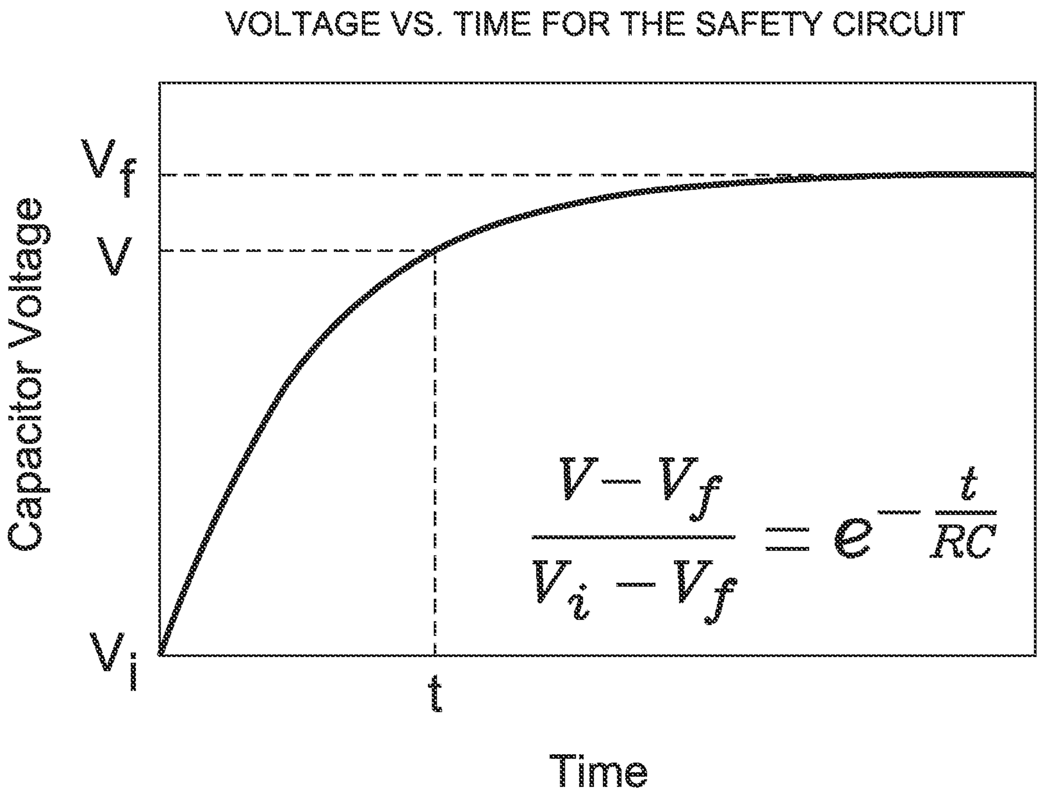
FIG. 6 is a plot of electric voltage vs. time for a capacitor model of the electrical connection of the safety switches.

Referring to FIG. 5, in yet another embodiment of the current invention, the irrigation system 10 is configured to identify an open safety switch 30 by determining a change in voltage rise time of a path of the safety circuit 34. The safety circuit 34 includes a first path 46, which leads from the first port of the safety signal source 42 along multiple cables 44 through each safety switch 30 to the safety switch 30 at the last tower 12N, and a second path 48, which leads from the second port of the safety signal source 42 along the single cable 44 (the return cable 44) to the safety switch 30 at the last tower 12N. The first path 46 is roughly equal in length to the second path 48. Each path 46, 48 includes electrically conductive components that can be modeled as, and behave like, a capacitor whose capacitance varies according to the length of the path 46, 48, wherein a longer length corresponds to a greater capacitance and a shorter length corresponds to a lesser capacitance. With reference to FIG. 6, in addition, a voltage rise time, i.e., a period of time for the voltage across the capacitor to rise from an initial level, $V_i$, to a final level, $V_f$, varies according to the capacitance, C, of the capacitor (along with a resistance, R, along the path 46, 48), wherein a greater capacitance corresponds to a larger rise time and a lesser capacitance corresponds to a smaller rise time. Since capacitance also varies according to the length of the path 46, 48, voltage rise time also varies according to a length of the path 46, 48, wherein a longer length of the path 46, 48 corresponds to a larger rise time and a shorter length corresponds to a smaller rise time. Thus, by measuring the rise time of a voltage applied to the first path 46 and the second path 48, the length of each path can be determined. Furthermore, any open safety switch 20 along the first path 46 will shorten its length compared to the second path 48, and therefore, reduce the voltage rise time of the first path 46 compared to voltage rise time of the second path 48. Given that the distance from the center pivot 16 to each tower 12 is known, the identity or location of the open safety switch 30 may be determined as the tower 12 whose distance from the center pivot 16 is roughly equal to the length of the first path 46, as determined by the voltage rise time.

In the current embodiment of the irrigation system 10, the TDR unit 32 is optional and may not be included. Instead, the central controller 14 additionally includes a charge signal generator 50 and a comparator 52. The charge signal generator 50 outputs a charge signal and may include electronic signal generators, voltage sources, or the like, or combinations thereof. The charge signal is typically a step increase in voltage from zero (0) Volts to a charge voltage ($V_f$). The charge signal generator 50 also includes a first port electrically connected to the first path 46 and a second port electrically connected to the second path 48. The charge signal generator 50 outputs the charge signal on each of the first and second ports. In addition, the charge signal generator 50 may receive instruction from the processing element 40 to output the charge signal.

The comparator 52 compares the rising voltage on either the first path 46 or the second path 48 to the charge voltage. The comparator 52 may include one or more op amps, sampling ADCs, logic processors, or the like, or combinations thereof. The comparator 52 may be integrated with the charge signal generator 50 or the processing element 40. The comparator 52 also includes a first port electrically connected to the first path 46 and a second port electrically connected to the second path 48. The comparator 52 also outputs a comparator signal, to be received by the processing element 40, that indicates whether the voltage on either path 46, 48 has risen to the charge voltage or a percentage, such as 90%, of the charge voltage. The comparator signal may have a first voltage level or binary value when the voltage on either path 46, 48 is less than the charge voltage and a second voltage level or binary value when the voltage on either path 46, 48 is equal to or greater than the charge voltage.

The irrigation system 10 may operate as follows. During normal operation of the irrigation system 10, the processing element 40 may instruct the charge signal generator 50 on a regular basis, such as once per day, to output the charge signal along the second path 48. At roughly the same time, the processing element 40 may start a timer. The comparator monitors the rising voltage on the second path 48 and when the rising voltage reaches the charge voltage (or a percentage thereof), the comparator signal output from the comparator 52 indicates that the rising voltage has reached the charge voltage. The processing element 40 receives the indication that the rising voltage has reached the charge voltage and stops the timer, thus measuring the rise time of the voltage on the second path 48. If the rise time is different from an average of previously recorded rise times by an error threshold, this may indicate an error or malfunction in one or more components of the irrigation system 10 and the processing element 40 may shut down the irrigation system 10 and transmit an alert message. Otherwise, if the rise time is within an acceptable margin of the historical average, then the rise time is stored as the current standard rise time.

The safety signal source 42 also outputs and receives the safety signal. If the safety signal is no longer received due to an open safety switch 30, the safety signal source 42 outputs the status signal which indicates the safety signal is not being received. The status signal is communicated to the processing element 40. Upon notification that the safety signal is not being received, the processing element 40 instructs the charge signal generator 50 to output the charge signal, and the processing element 40 starts the timer. The charge signal generator 50 outputs the charge signal to the first path 46, and the comparator 52 detects the rising voltage on the first path 46. When the rising voltage is roughly equal to the charge voltage, the comparator signal output from the comparator 52 indicates that the rising voltage has reached the charge voltage. The processing element 40 receives the indication that the rising voltage has reached the charge voltage and stops the timer, thus measuring the rise time of the voltage on the first path 46. The processing element 40 compares the recently measured rise time to the current standard rise time—perhaps by dividing the measured rise time by the current standard rise time to determine a rise time percentage. The rise time percentage is also equivalent to the percentage of length of the first path 46 (now with an open safety switch 30 that shortens the path 46) compared to the length of the second path 48 (which also the total length of the safety circuit 34). Given that the processing element 40 has access to a listing of the distances of each tower 12 from the center pivot 16, the processing element 40 determines which tower 12 has a distance from the center pivot 16 that is closest the reduced length of the first path 46. For example, if the rise time percentage equals 48% and the length of the second path 48 is 500 feet, the reduced length of the first path 46 is 0.48×500=240 feet. If the distance between consecutive towers 12 is 50 feet and the first tower 12A is 50 feet from the center pivot 16, then the fifth tower 12 is 250 feet from the center pivot 16 and is closest to the reduced distance of the first path 46. Thus, the open switch 30 is likely located at the fifth tower 12. Accordingly, the processing element 40 determines at least one of a location of the open safety switch 30 and an identifier of the tower 12 associated with the open safety switch 30. The processing element 40 may further output a message indicating the tower 12, or the location of the tower 12, which has the open safety switch 30. Therefore, the technician arriving to repair the irrigation system 10 knows which tower 12 to check. In addition, or instead, the message may be displayed on a display at the center pivot 16.

Throughout this specification, references to “one embodiment”, “an embodiment”, or “embodiments” mean that the feature or features being referred to are included in at least one embodiment of the technology. Separate references to “one embodiment”, “an embodiment”, or “embodiments” in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term “processing element” or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing", "computing", "calculating", "determining", "presenting", "displaying", or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises", "comprising", "includes", "including", "has", "having", or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

The invention claimed is:

1. An irrigation system comprising:
- a plurality of towers, each tower including a successive one of a plurality of safety switches, each safety switch being either closed or open, the safety switch of each tower electrically connected to at least one safety switch of another tower;
- a time domain reflectometry (TDR) unit electrically connected to at least one safety switch, the TDR unit configured to
  - output an electronic TDR signal and receive reflections of the TDR signal, and
  - output data indicating a distance from the TDR unit to an open safety switch; and
- a central controller configured to:
  - receive data from the TDR unit, and
  - determine, according to the data from the TDR unit, at least one of a location of the open safety switch and an identifier of the tower associated with the open safety switch.

2. The irrigation system of claim 1, wherein the central controller is further configured to output a message to a display, the message indicating at least one of the location of the open safety switch and the identifier of the tower associated with the open safety switch.

3. The irrigation system of claim 1, wherein the central controller is further configured to transmit a message to an external receiver, the message indicating at least one of the location of the open safety switch and the identifier of the tower associated with the open safety switch.

4. The irrigation system of claim 1, wherein the data from the TDR unit includes a distance or a representation of the distance from the TDR unit to the open safety switch.

5. The irrigation system of claim 4, wherein the central controller is further configured to perform mathematical calculations on the data to determine at least one of a location of the open safety switch and an identifier of the tower associated with the open safety switch according to the distance from the TDR unit to the open safety switch.

6. The irrigation system of claim 1, wherein the TDR signal includes a step or an impulse of electric voltage or electric current.

7. The irrigation system of claim 1, wherein the central controller is further configured to instruct the TDR unit to output the control signal.

8. The irrigation system of claim 1, wherein each safety switch is a toggle type switch and the switches are electrically connected to one another in series.

9. An irrigation system comprising:
- a plurality of towers, each tower including a successive one of a plurality of safety switches, each safety switch being either closed or open, the safety switch of each tower electrically connected to at least one safety switch of another tower;

a time domain reflectometry (TDR) unit electrically connected to at least one safety switch, the TDR unit configured to output an electronic TDR signal, receive reflections of the TDR signal, and output data specifying a distance from the TDR unit to an open safety switch; and a central controller configured to:

receive data from the TDR unit, and perform mathematical calculations on the data to determine at least one of a location of the open safety switch and an identifier of the tower associated with the open safety switch.

10. The irrigation system of claim 9, wherein the data from the TDR unit includes a distance or a representation of the distance from the TDR unit to the open safety switch.

11. The irrigation system of claim 9, wherein each safety switch is a toggle type switch and the switches are electrically connected to one another in series.

12. The irrigation system of claim 9, wherein the central controller is further configured to instruct the TDR unit to output the control signal.

13. The irrigation system of claim 9, wherein the TDR signal includes a step or an impulse of electric voltage or electric current.

14. A method for identifying an open safety switch in an irrigation system, the irrigation system including a plurality of towers, the method comprising:

electrically connecting a TDR unit to at least one safety switch in the irrigation system, the irrigation system including a plurality of safety switches electrically connected to one another in series, each safety switch being either open or closed and being associated with a successive one of the towers;

instructing the TDR unit to output an electronic TDR signal, receive reflections of the TDR signal, and output data indicating a distance from the TDR unit to an open safety switch; and determining, according to the data from the TDR unit, at least one of a location of the open safety switch and an identifier of the tower associated with the open safety switch.

15. The method of claim 14, further comprising outputting a message to a display, the message indicating at least one of the location of the open safety switch and the identifier of the tower associated with the open safety switch.

16. The method of claim 14, further comprising transmitting a message to an external receiver, the message indicating at least one of the location of the open safety switch and the identifier of the tower associated with the open safety switch.

17. The method of claim 14, wherein each safety switch is a toggle type switch.

18. The method of claim 14, wherein the TDR signal includes a step or an impulse of electric voltage or electric current.

* * * * *